United States Patent [19]
Sakaguchi et al.

[11] Patent Number: 5,628,110
[45] Date of Patent: May 13, 1997

[54] INSPECTING METHOD OF AN ELECTRONIC COMPONENT DURING A MOUNTING OPERATION OF THE SAME ONTO A SUBSTRATE

[75] Inventors: Hiroyuki Sakaguchi, Fukuoka; Yoshiaki Awata, Kurume, both of Japan

[73] Assignee: Matsushita Electric Industrial Co., Ltd., Osaka, Japan

[21] Appl. No.: 502,230

[22] Filed: Jul. 14, 1995

[30] Foreign Application Priority Data

Jul. 15, 1994 [JP] Japan ................................. 6-164028

[51] Int. Cl.$^6$ ................................................. H05K 3/34
[52] U.S. Cl. ................................. 29/840; 356/375; 29/832
[58] Field of Search ..................... 29/840, 832; 356/273, 356/375

[56] References Cited

U.S. PATENT DOCUMENTS

| | | | |
|---|---|---|---|
| 5,114,229 | 5/1992 | Hideshima | 357/237 |
| 5,208,463 | 5/1993 | Honma et al. | 356/394 |
| 5,287,759 | 2/1994 | Kaneda | 356/375 |
| 5,329,359 | 7/1994 | Tachikawa | 356/394 |

Primary Examiner—P. W. Echols
Assistant Examiner—Adrian L. Coley
Attorney, Agent, or Firm—Lowe, Price, LeBlanc & Becker

[57] ABSTRACT

An electronic component is inspected before it is mounted onto a substrate. The electronic component has a plurality of lead rows, each lead row including plural leads arrayed in a line along and protruding from a side face of a main body of the electronic component. Positional data of the plural leads, including altitudinal values representing heights of respective leads, are measured. A plurality of approximate lines are obtained on the basis of the positional data, each approximate line approximating each lead row on a side face of the electronic component main body. Any faulty lead, extraordinarily deformed compared with other leads, is detected on the basis of the positional data. A mutual positional relationship is obtained between the approximate lines, and it is judged whether the mutual positional relationship is within a predetermined range. Then, the leads of the electronic component are positioned onto electrodes of the substrate applied solder thereon only when the faulty lead is not detected and the mutual positional relationship is within the predetermined range. Thereafter, the substrate is heated and the solder is melted to provide a permanent rigid connection between the leads and the electrodes.

12 Claims, 10 Drawing Sheets

APPROXIMATE LINE DATA

|  | INCLINATION | INTERCEPT |
|---|---|---|
| #1 SIDE | $a_1$ | $b_1$ |
| #2 SIDE | $a_2$ | $b_2$ |
| #3 SIDE | $a_3$ | $b_3$ |
| #4 SIDE | $a_4$ | $b_4$ |

| LEAD NO. | PRIMARY LEAD FLOATING AMOUNT $\Delta Z_i$ | SECONDARY LEAD FLOATING AMOUNT $S_i$ | FLAG $F_j$ |
|---|---|---|---|
| 1 | . | . | 0 |
| 2 | . | . | 0 |
| . | . | . | . |
| . | . | . | . |
| . | . | . | 1 |
| N | . | . |  |

1 SIDE
2 SIDE
3 SIDE
4 SIDE

FIG. 10

| | APPROXIMATE LINE | END POINTS (XYZ COORDINATES) |
|---|---|---|
| #1 SIDE | $L_1$ | $R_1\ (0,\ W_2,\ Q_1)$ |
| | | $R_2\ (W_1,\ W_2,\ Q_2)$ |
| #2 SIDE | $L_2$ | $R_3\ (W_1,\ W_2,\ Q_3)$ |
| | | $R_4\ (W_1,\ 0,\ Q_4)$ |
| #3 SIDE | $L_3$ | $R_5\ (W_1,\ 0,\ Q_5)$ |
| | | $R_6\ (0,\ 0,\ Q_6)$ |
| #4 SIDE | $L_4$ | $R_7\ (0,\ 0,\ Q_7)$ |
| | | $R_8\ (0,\ W_2,\ Q_8)$ |

FIG. 11

| LEAD NO. | Z COORDINATE $Z_i$ | ALTITUDINAL DIFFERENCE $K_i$ | JUDGE FLAG $F_j$ |
|---|---|---|---|
| 1 | $Z_1$ | $\|Z_2 - Z_1\|$ | 0 |
| 2 | $Z_2$ | $\|Z_3 - Z_2\|$ | 0 |
| . | . | . | . |
| . | . | . | . |
| . | . | . | 1 |
| N | . | . | |

INSPECTING METHOD OF AN ELECTRONIC COMPONENT DURING A MOUNTING OPERATION OF THE SAME ONTO A SUBSTRATE

BACKGROUND OF THE INVENTION

1. Field of the Invention

This invention relates to an inspecting method of an electronic component having a plurality of lead rows, each comprising a plurality of leads arrayed in a line along and protruding from a face of the main body thereof, and mounting method of the same onto a substrate.

2. Prior Art

When electronic components, such as QFP and SOP, having plural leads protruding outward from each face thereof are mounted onto substrates, it is usually necessary to perform an inspection prior to the mounting operation for checking the defectiveness of configuration of each component. The mounting operation of the electronic components, such as QFP and SOP, is usually carried out in the following manner. A substrate having electrodes applied solder (or solder paste) thereon is prepared in advance. The leads of the electronic component are landed onto their corresponding electrodes of the substrate, thereby mounting the electronic component on the substrate. The substrate mounting the electronic component is subsequently heated and later cooled down to provide a permanent rigid connection between the leads and their corresponding electrodes. In this soldering operation, if any lead is extraordinarily deformed in an up-and-down direction among plural leads arrayed in a line, an open-circuit defect will possibly arise. To avoid such a failure, it is definitely necessary to conduct an inspection prior to the mounting operation of the electronic component onto a substrate, for checking the presence of an extraordinary deformation of lead in the up-and-down direction (i.e. a floating of lead) and omitting or abandoning the defective components if found in this inspection so as not to be soldered onto the substrate.

One of conventional lead inspecting methods is carried out in the following manner. Of plural leads of an electronic component, only three leads are chosen as representative thereof. Respective heights of these three leads are measured, and a virtual plane including these three altitudinal points is obtained. Then, other leads are compared with this virtual plane to obtain a floating amount (i.e. vertical deviation) of each lead with respect to the given virtual plane. Then, each of the floating amounts obtained is compared with a predetermined allowable value, to omit or abandon defective electronic components.

However, according to such a conventional lead inspecting method, there is a possibility that at least one of the selected three leads is extraordinarily deformed compared with other leads, resulting in that an obtainable virtual plane is fairly deviated from an ideal virtual plane and the reliability of inspection results is so worsened.

Furthermore, many of recent electronic components are thinned in thickness. Thus, the main body itself of an electronic component may cause a deformation which possibly induces an open-circuit defect as well as presence of extraordinarily deformed leads. In this respect, the conventional lead inspecting method is not so effective to overcome the above-described problems, and therefore cannot always assure an accurate detection of defectiveness of an electronic component.

SUMMARY OF THE INVENTION

Accordingly, in view of above-described problems encountered in the prior art, a principal object of the present invention is to provide a reliable method for inspecting an electronic component and a method for mounting thus inspected electronic component onto a substrate.

In order to accomplish this and other related objects, a first aspect of the present invention provides a method for inspecting an electronic component having a plurality of lead rows, each lead row including plural leads arrayed in a line along and protruding from a side face of a main body thereof, the method comprising steps of: measuring positional data of the plural leads, the positional data including altitudinal values representing heights of respective leads; obtaining a plurality of approximate lines on the basis of the positional data, each approximate line approximating each lead row of the plural leads on a side face of the main body of the electric component; and obtaining a mutual positional relationship between the approximate lines, and judging whether the mutual positional relationship is within a predetermined range.

A second aspect of the present invention provides a method for inspecting an electronic component having a plurality of lead rows, each lead row including plural leads arrayed in a line along and protruding from a side face of a main body thereof, the method comprising steps of: measuring positional data of the plural leads, the positional data including altitudinal values representing heights of respective leads; obtaining approximate lines on the basis of the positional data, each approximate line approximating each lead row of the plural leads on a side face of the main body of the electric component; detecting a faulty lead on the basis of the positional data, the faulty lead being extraordinarily deformed compared with other leads constituting a same lead row; and obtaining a mutual positional relationship between the approximate lines, and judging whether the mutual positional relationship is within a predetermined range.

A third aspect of the present invention provides a method for mounting an electronic component onto a substrate, the electronic component having a plurality of lead rows, each lead row including plural leads arrayed in a line along and protruding from a side face of a main body of the electronic component, the method comprising steps of: measuring positional data of the plural leads, the positional data including altitudinal values representing heights of respective leads; obtaining a plurality of approximate lines on the basis of the positional data, each approximate line approximating each lead row of the plural leads on a side face of the main body of the electric component; obtaining a mutual positional relationship between the approximate lines, and judging whether the mutual positional relationship is within a predetermined range; positioning the leads of the electronic component onto electrodes of the substrate only when the mutual positional relationship is within the predetermined range, the electrodes being applied solder beforehand; and heating the substrate mounting the electronic component and melting the solder to provide a rigid connection between the leads and the electrodes.

A fourth aspect of the present invention provides a method for mounting an electronic component onto a substrate, the electronic component having a plurality of lead rows, each lead row including plural leads arrayed in a line along and protruding from a side face of a main body of the electronic component, the method comprising steps of: measuring positional data of the plural leads, the positional data including altitudinal values representing heights of respective leads; obtaining a plurality of approximate lines on the basis of the positional data, each approximate line approximating each lead row of the plural leads on a side face of the main body of the electric component; detecting a faulty lead on the basis of the positional data, the faulty lead being extraordinarily deformed compared with other leads constituting a same lead row; obtaining a mutual positional relationship between the approximate lines, and judging whether the mutual positional relationship is within a predetermined range; positioning the leads of the electronic component onto electrodes of the substrate only when the faulty lead is not detected and the mutual positional relationship is within the predetermined range, the electrodes being applied solder beforehand; and heating the substrate mounting the electronic component and melting the solder to provide a rigid connection between the leads and the electrodes.

In the above first to fourth aspects of the present invention, it is preferable that the step of obtaining the mutual positional relationship between the approximate lines and judging whether the mutual positional relationship is within the predetermined range is executed by obtaining an altitudinal difference between corresponding edge points of adjacent two approximate lines, and judging whether the altitudinal difference is within the predetermined range. Alternatively, the step of obtaining the mutual positional relationship between the approximate lines and judging whether the mutual positional relationship is within the predetermined range is executed by obtaining an altitudinal difference between corresponding edge points of opposing two approximate lines, and judging whether the altitudinal difference is within the predetermined range.

With the above-described methods, each lead row can be represented by an approximate line. A mutual relationship between any two approximate lines thus obtained is checked if it is within a predetermined range, thereby detecting an extraordinary deformation of the lead row of the inspected electronic component. Furthermore, only electronic components judges to be ordinary in the above inspection are mounted and rigidly fixed on substrates by soldering the leads of the electronic component onto electrodes of the substrates applied solder thereon.

BRIEF DESCRIPTION OF THE DRAWINGS

The above and other objects, features and advantages of the present invention will become more apparent from the following detailed description which is to be read in conjunction with the accompanying drawings, in which:

FIG. 10 is a view showing another example of data construction stored in a memory, expressing end points of approximate lines, adopted in the electronic component inspecting method in accordance with the embodiment of the present invention;

FIG. 11 is a view showing another example of data construction stored in a memory, expressing alternative lead floating amounts, adopted in the electronic component inspecting method in accordance with the embodiment of the present invention;

DETAILED DESCRIPTION OF THE PREFERRED EMBODIMENT

Figure 1:
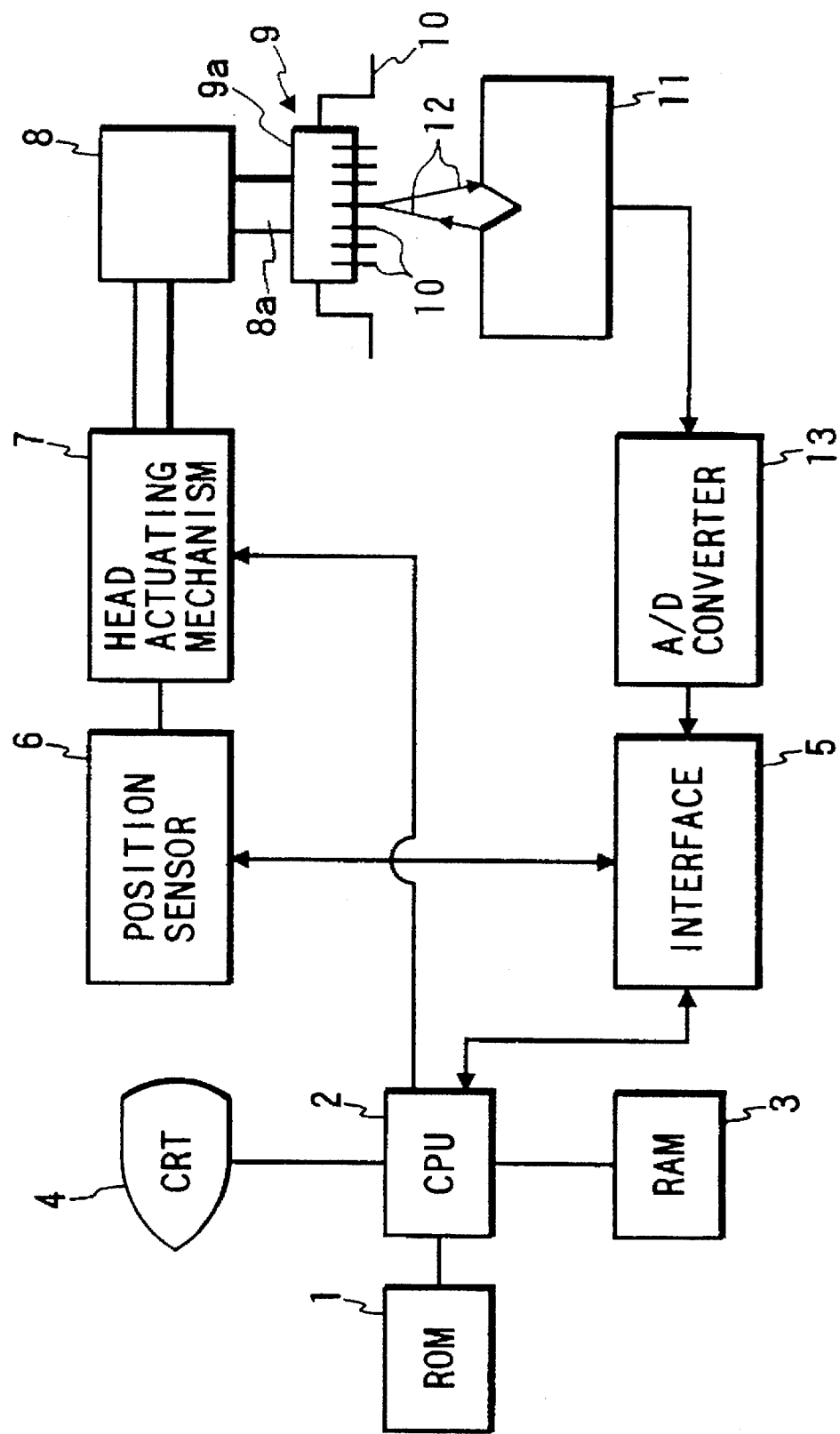
FIG. 1 is a schematic block diagram showing an inspecting/mounting apparatus embodying an inspecting method of an electronic component in accordance with one embodiment of the present invention.

A preferred embodiment of the present invention will be explained in greater detail hereinafter, with reference to the accompanying drawings. Identical parts are denoted by identical reference numeral throughout views.

FIG. 1 is a schematic block diagram showing an inspecting/mounting apparatus embodying an inspecting/mounting method of an electronic component in accordance with one embodiment of the present invention. In FIG. 1, reference numeral 1 represents a ROM (read only memory) memorizing control programs represented by the flow charts of FIGS. 3 and 4. Reference numeral 2 represents a CPU (central processing unit) controlling the inspecting/mounting apparatus. Reference numeral 3 represents a RAM (random access memory) having memory regions for storing data shown in FIGS. 6, 7, 8, 10 and 11. Reference numeral 4 represents a CRT (cathode-ray tube) which visually notifies an operator of inspection results. Reference numeral 5 represents an interface connected to the CPU 2. Reference numeral 8 represents a transportation head which holds and shifts an electronic component 9 with its nozzle 8a holding the electronic component 9 by suction.

Reference numeral 7 represents a head actuating mechanism which shifts the transportation head 8 in a horizontal direction (i.e. along an X-Y plane). The head actuating mechanism 7 is, for example, constituted by a rectangular-coordinates table equipped with two shift axes orthogonal with each other. Reference numeral 6 represents a position sensor detecting a momentary position of the transportation head 8. The position sensor 6 is constituted by an encoder accommodated in the head actuating mechanism 7 and a signal processing unit (not shown) counting pulse signals sent from the encoder to calculate the present position of the transportation head 8.

The electronic component 9 is provided with a plurality of leads 10 protruding outward from side faces thereof. This electronic component 9 is a QFP having four side faces each being provided with a plurality of leads 10 arrayed in a line and protruding outward. Reference numeral 11 represents a laser sensor which is capable of irradiating a laser beam 12 toward each lead 10 and receiving a reflected laser beam 12, thereby detecting a height "Z" of each lead 10. Reference numeral 13 represents an A/D converter converting output signals of the laser sensor 11 from analog into digital form, and then sending the digitized output signals to the interface 5.

Thus, the laser sensor 11 is fixed at a predetermined stationary position to generate the laser beam 12. The head actuating mechanism 7 moves the transportation head 8 along an X-Y plane at a height spaced a constant distance from the laser sensor 11, thereby successively irradiating the laser beam 12 toward each of leads 10 arrayed in a line.

The CPU 2 reads the signals sent from the position sensor 6 and the laser sensor 11 through the interface 5, and the RAM 3 stores these read data expressed in the form of XYZ coordinates representing each of plural leads 10.

Figure 2:
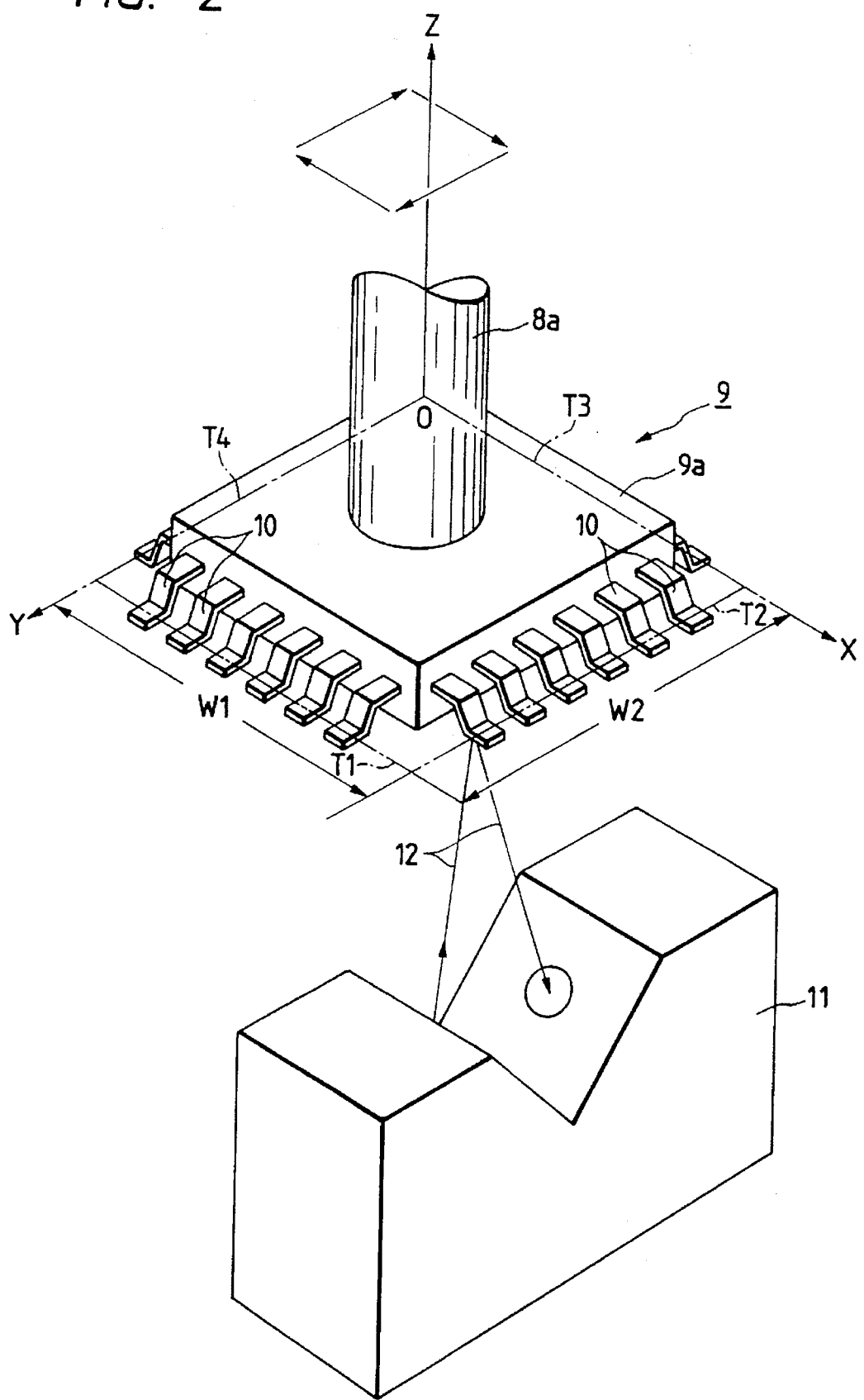
FIG. 2 is an enlarged perspective view showing details of an electronic component and a laser sensor employed in the inspecting apparatus in accordance with the embodiment of the present invention.

FIG. 2 is an enlarged perspective view showing details of the electronic component 9 and the laser sensor 11 employed in the present embodiment. The laser beam 12 is emitted upward from the laser sensor 11 toward one of leads 10 of the electronic component 9, and reflected by a flat face of that lead 10 (a distal end portion of the lead 10 to be soldered onto a substrate). The reflected beam 12 is received by the laser sensor 11. The transportation head 8 is moved in a horizontal direction, along straight lines T1, T2, T3 and T4 each substantially connecting flat faces of plural leads 10 arrayed in a line and protruding from each side face of the rectangular electronic component 9, thereby allowing the laser sensor 11 to scan each lead 10 and measure the position of the same (i.e. a distance between the laser sensor 11 and each lead 10).

In this embodiment, the coordinate system for representing the position of each lead 10 is defined in the following manner. An intersecting point of the straight lines T3 (#3 side) and T4 (#4 side) which are orthogonal each other is specified as an origin "0" of the coordinate system for the present embodiment. The straight line T3 (#3 side) is specified as an X axis, while the straight line T4 (#4 side) is specified as a Y axis. An axis passing through the origin "0" and perpendicular to both the X and Y axes is specified as a Z axis. The straight line T1 (#1 side) is laid on an XY plane and parallel to the X axis. The straight line T2 (#2 side) is also laid on an XY plane but parallel to the Y axis. The straight lines T1 and T3 are equal in length W1. The straight lines T2 and T4 are equal in length W2. These lengths W1 and W2 can be beforehand known from the size or dimensions of the given electronic component 9.

Figure 3:
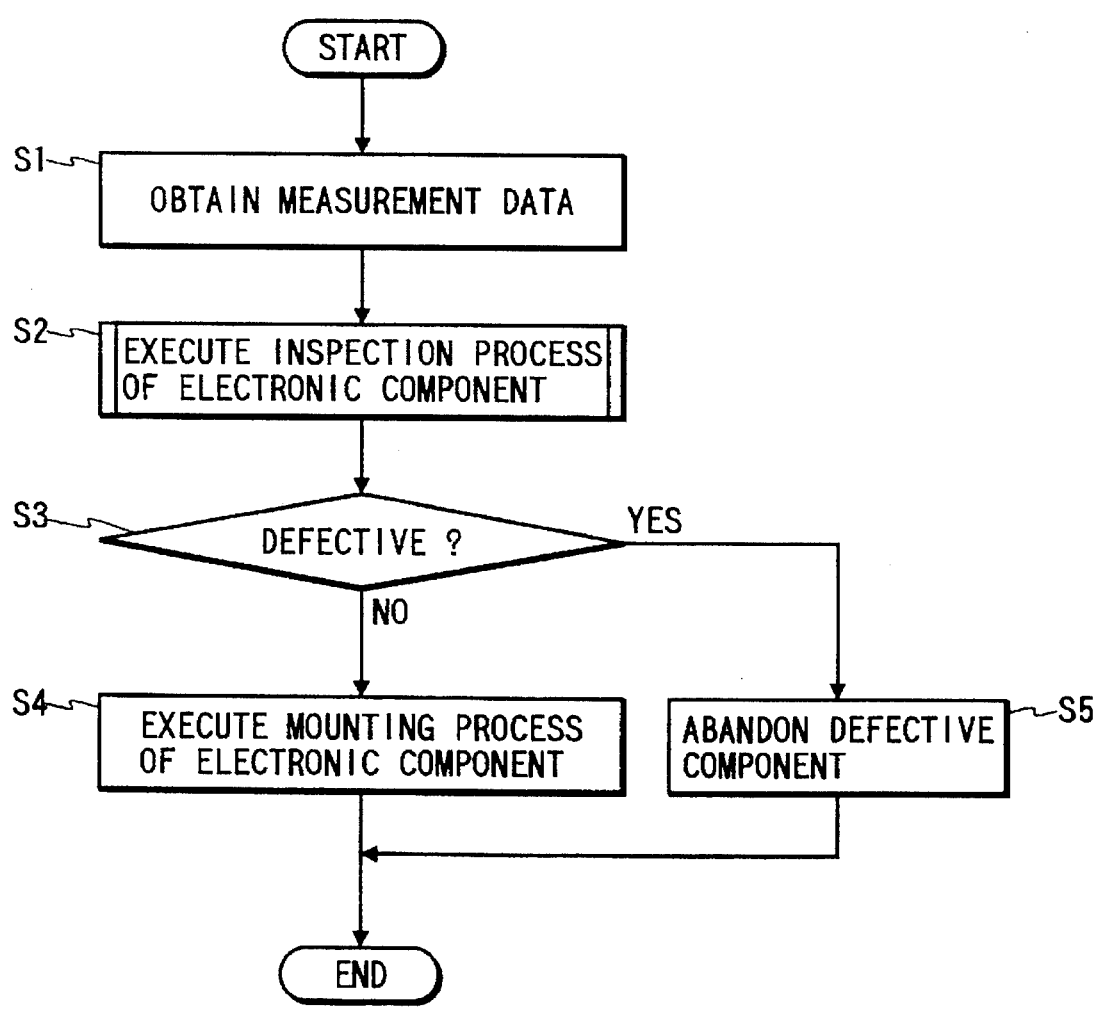
FIG. 3 is a flow chart showing an operation of the inspecting/mounting apparatus in accordance with the embodiment of the present invention.

Next, referring to a flow chart of FIG. 3, the operation of the inspecting/mounting apparatus in accordance with the embodiment of the present invention will be explained hereinafter.

Figure 6:
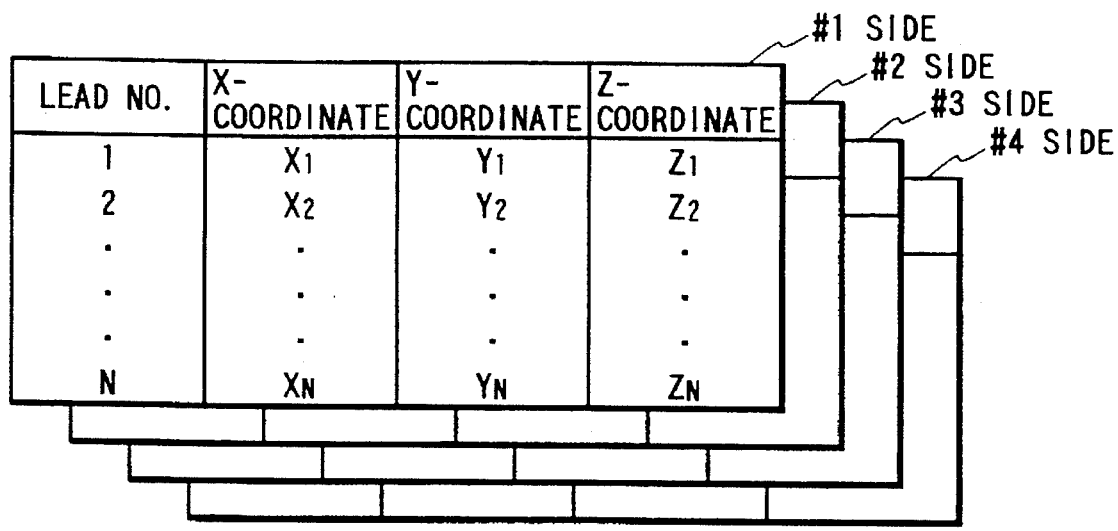
FIG. 6 is a view showing an example of data construction stored in a memory, expressing positions of leads, adopted in the electronic component inspecting method in accordance with the embodiment of the present invention.

The electronic component 9 is supplied from an appropriate parts-feeding station (not shown) and is then transported just above the laser sensor 11, being sucked and held by the nozzle 8a of the transportation head 8. In a step 1, the CPU 2 obtains data representing XYZ-coordinates of each distal flat face (a reverse surface) of all the leads 10 protruding from four, #1–#4, side faces of the electronic component 9, using the laser sensor 11. The obtained data are stored in the RAM 3. FIG. 6 shows an example of data construction stored in the RAM 3, expressing the position, i.e. XYZ-coordinate data, of each lead.

Next, the CPU 2 executes an electronic component inspecting process (step 2) for judging a configuration of the electronic component 9 based on positional data of leads 10. Details of the step 2 will be explained later in greater detail. Thereafter, the CPU 2 makes a judgement in a step 3 as to whether or not the configuration of the inspected electronic component 9 is defective. If the inspected electronic component 9 is judged to be non-defective, the CPU 2 proceeds to a step 4 to mount the inspected electronic component onto a predetermined position on a designated substrate. On the contrary, if the inspected electronic component 9 is judged to be defective, the CPU 2 proceeds to a step 5 to abandon the defective component.

Next, details of the electronic component inspecting process (Step 2) will be explained with reference to FIGS. 4 through 13.

Figure 4:
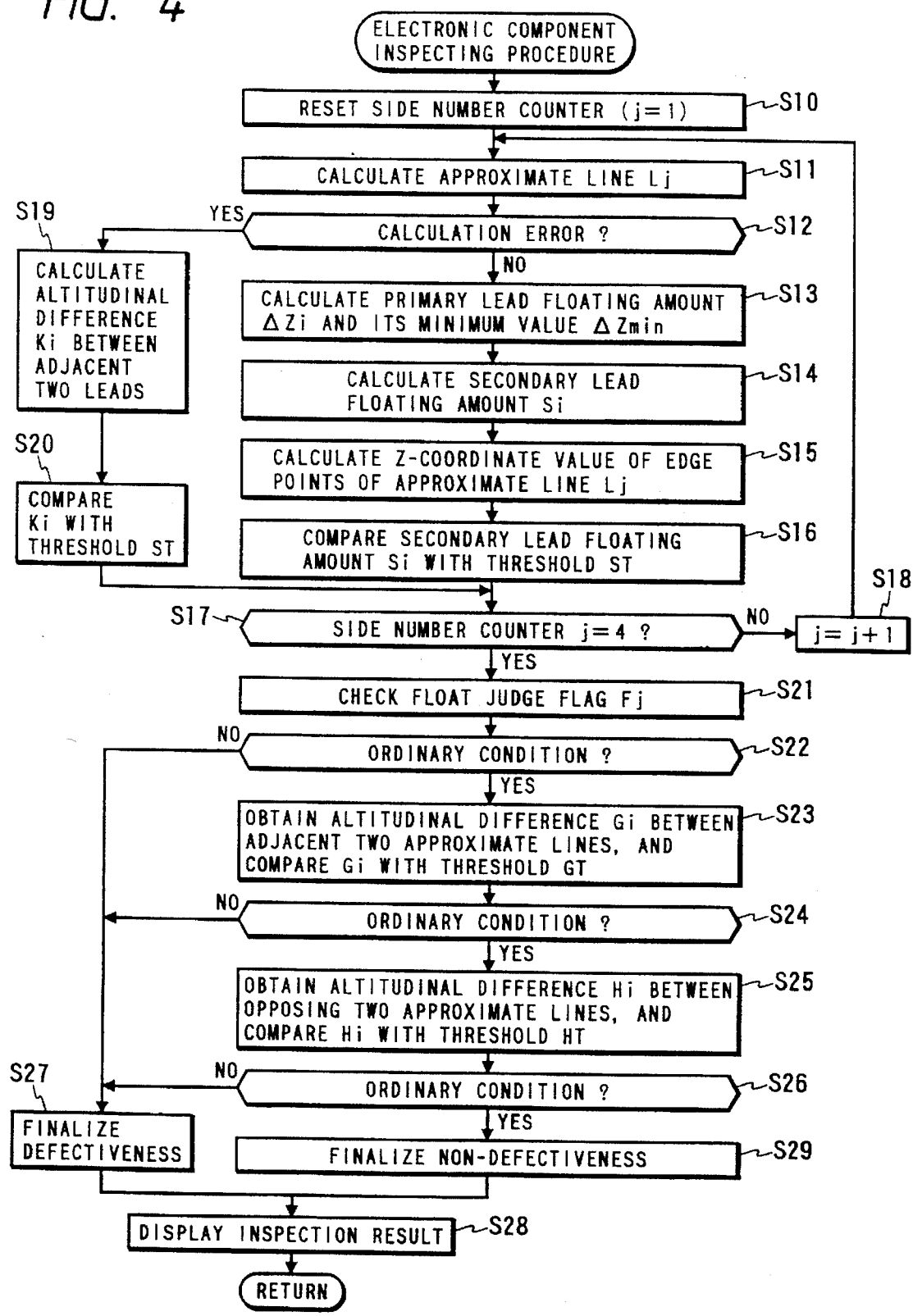
FIG. 4 is a flow chart showing details of an electronic component inspecting method in accordance with the embodiment of the present invention.
Figure 5:
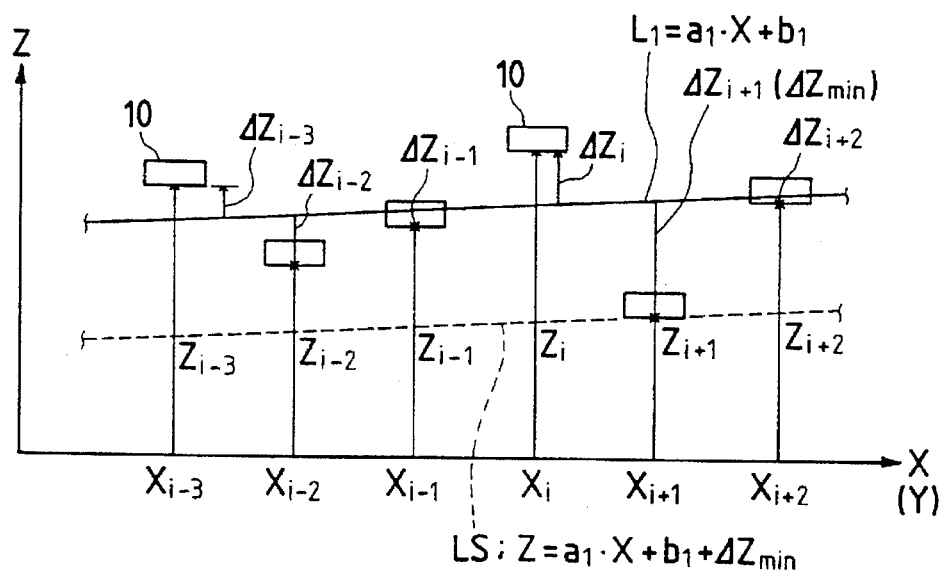
FIG. 5 is a graph illustrating an approximate straight line adopted in the electronic component inspecting method in accordance with the embodiment of the present invention.

FIG. 4 is a flow chart showing an electronic component inspecting method in accordance with the embodiment of the present invention. FIG. 5 is a graph illustrating an approximate straight line adopted in the electronic component inspecting method in accordance with the embodiment of the present invention.

In FIG. 5, $X_{i-3}$, $X_{i-2}$, - - - and $X_{i+2}$ represent X coordinates of respective leads 10 arrayed in a line and protruding from one side face of the electronic component 9, while $Z_{i-3}$, $Z_{i-2}$, - - - and $Z_{i+2}$ represent Z coordinates of the same leads 10. In this embodiment, the side face of the electronic component 9 is #1 or #3 side. The Y-coordinate value is W2 for the #1 side and 0 for the #3 side.

Now, along the flow chart of FIG. 4, each step of the electronic component inspecting method of the present embodiment will be explained. First of all, in a step 10, the CPU 2 sets a side number counter "j" to 1. The side number counter "j" identifies a side to be inspected among the #1 to #4 sides of the electronic component 9, by designating its own side number (#1 through #4). More specifically, when the side number counter "j" is set to 1 (i.e. j=1), a lead row of the leads 10 arrayed along the #1 side of the electronic component 9 is an object to be inspected in the present cycle of flow.

Next, in a step 11, the CPU 2 calculates an approximate straight line $L_1$ (i.e. j=1) which approximates the row of plural leads 10 arrayed in a line along the #1 side face of the electronic component 9, based on the XYZ coordinates data representing respective leads 10 measured in advance (in the step 1), using the least square method as follows.

$$L_1 = a_1 \cdot X + b_1 \quad (1)$$

$$a_1: \sum_{i=1}^{N} |(X_i - \overline{X}) \cdot (Z_i - \overline{Z})| / \sum_{i=1}^{N} |(X_i - \overline{X})^2|$$

$$b_1: \overline{Z} - a_1 \cdot \overline{X}$$

where $$\bar{X} = (1/N) \cdot \sum_{i=1}^{N} X_i, \bar{Z} = (1/N) \cdot \sum_{i=1}^{N} Z_i,$$

and N is the total number of leads 10 arrayed along the #1 side face of the electronic component 9.

Figures 7, 8:
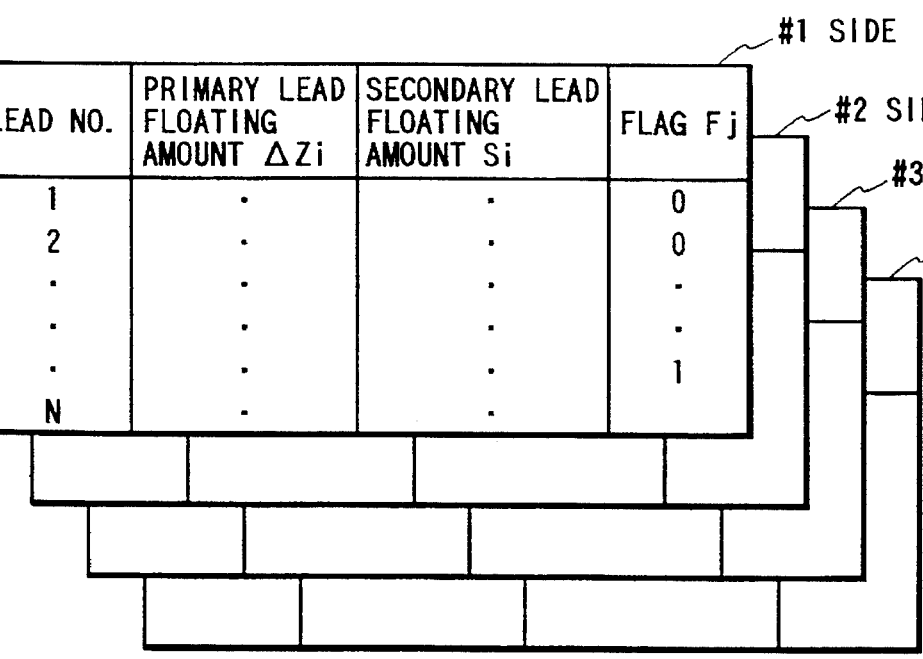
FIG. 7 is a view showing another example of data construction stored in a memory, expressing factors of approximate lines, adopted in the electronic component inspecting method in accordance with the embodiment of the present invention.
FIG. 8 is a view showing another example of data construction stored in a memory, expressing lead floating amounts, adopted in the electronic component inspecting method in accordance with the embodiment of the present invention.

The inclination $a_1$ and the intercept $b_1$, obtained from the above equations, are stored in a predetermined memory region of the RAM 3 having the data construction shown in FIG. 7. Subsequently, the CPU 2 checks in a step 12 whether any calculation errors are caused (for example, due to division by 0). If no calculation error is found, the CPU 2 proceeds to a step 13. On the contrary, if any calculation error is found, the CPU 2 proceeds to a step 19.

In the step 13, the CPU 2 obtains a lead floating amount $\Delta Zi$ (including a minimum value $\Delta Z_{min}$) of each lead 10 with respect to the approximate straight line $L_1$ obtained in the step 11. This lead floating amount (i.e. a plus or minus deviation of each lead 10 from the approximate straight line $L_1$ in a vertical direction) is specified as a primary lead floating amount $\Delta Z_i$. In this case, $\Delta Z_{min}$ represents the largest deviation in the minus direction. In FIG. 5, the flat lower surface of the distal end of each lead 10 is positioned above or below the approximate straight line $L_1$. Thus, $\Delta Z_{i-3}$, $Z_{i-2}$, - - - and $Z_{i+2}$ shown in FIG. 5 represent the primary lead floating amounts (an upward arrow indicates a positive value while a downward arrow indicates a negative value). The CPU 2 calculates the values of the primary lead floating amounts $\Delta Z_{i-3}$, $Z_{i-2}$, - - - and $Z_{i+2}$ and the RAM 3 stores these data in a predetermined memory region thereof. The minimum value $\Delta Z_{min}$ (which is definitely a negative value) is also obtained among the primary lead floating amounts $\Delta Z_k$, where k=i−3, i−2, - - - , i+2.

It is now assumed that the primary lead floating amount $\Delta Z_{i+1}$ is the minimum value $\Delta Z_{min}$. And, there is given an imaginary straight line LS which is parallel with the approximate straight line $L_1$ and is shifted downward from the straight line $L_1$ by an amount of the minimum value $\Delta Z_{min}$. Thus, in a step 14, the CPU 2 calculates a vertical deviation of the flat lower surface of the distal end of each lead 10 from the given imaginary straight line LS. The vertical deviation of each lead 10 with respect to the imaginary straight line LS is specified as a secondary lead floating amount $S_i$. The RAM 3 stores thus obtained secondary lead floating amounts $S_i$ in a predetermined memory region thereof. The secondary lead floating amount $S_i$ is simply obtained from the following equation.

$$S_i = \Delta Z_i - \Delta Z_{min} \qquad (2)$$

Figure 9:
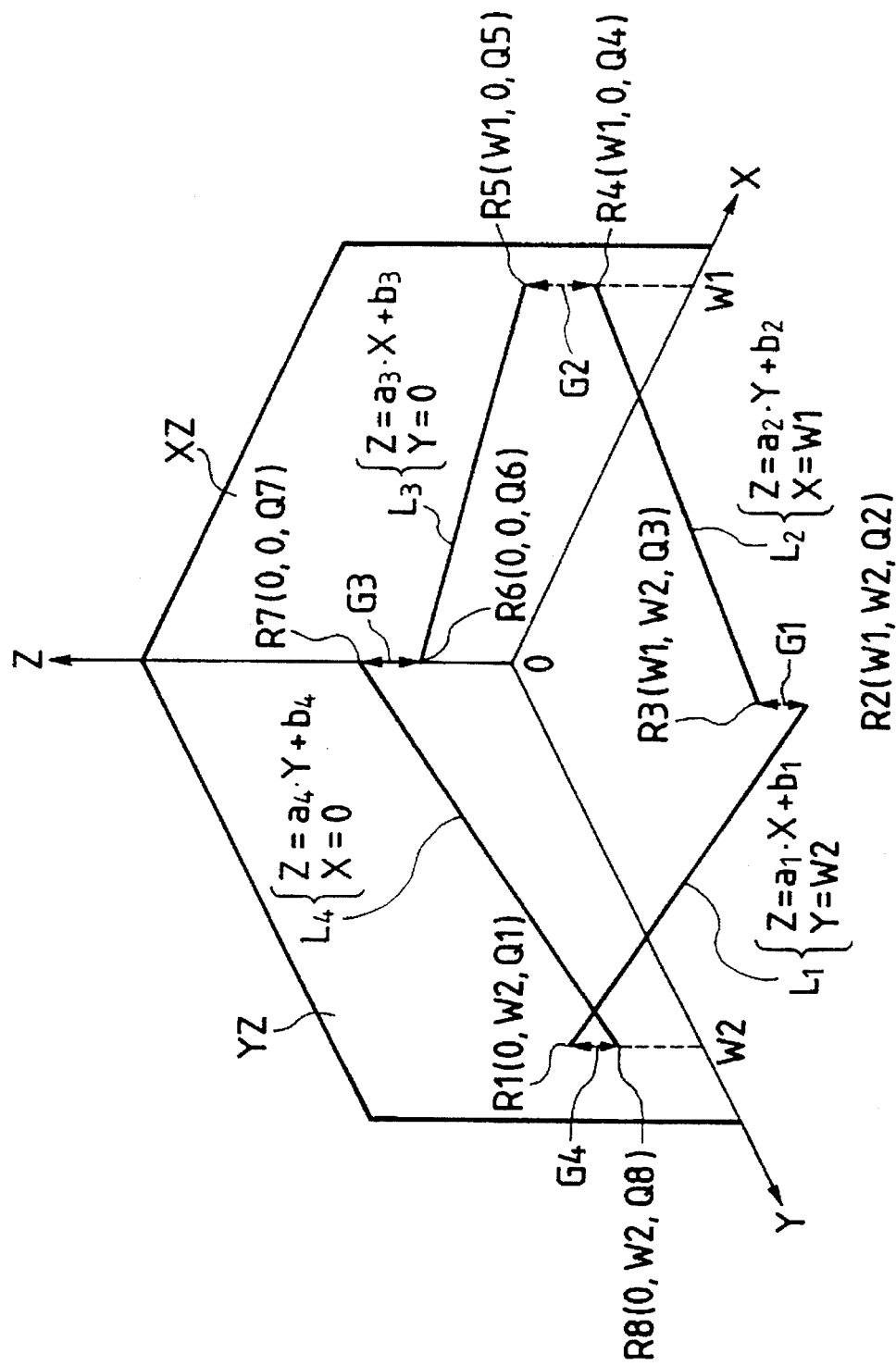
FIG. 9 is a perspective view showing positional relationship between approximate lines adopted in the electronic component inspecting method in accordance with the embodiment of the present invention.

After that, in a step 15, the CPU 2 calculates the Z-coordinate values Q1 and Q2 of both edge points R1 and R2 of the approximate straight line $L_1$ (refer to FIG. 9). Since the approximate straight line $L_1$ is in a definition region 0≦X≦W1, the values of Q1 and Q2 are given as Q1=$b_1$ and Q2=$a_1 \cdot$W1+$b_1$. In the same manner, in the case of an approximate straight line $L_2$, the Z-coordinate values Q3 and Q4 of the edge points R3 and R4 are given as Q3=$a_2 \cdot$W2+$b_2$ and Q4=$b_2$. For an approximate straight line $L_3$, the Z-coordinate values Q5 and Q6 of the edge points R5 and R6 are given as Q5=$a_3 \cdot$W1+$b_3$ and Q6=$b_3$. Also, for an approximate straight line $L_4$, the Z-coordinate values Q7 and Q8 of the edge points R7 and R8 are given as Q7=$b_4$ and Q8=$a_4 \cdot$W2+$b_4$. The RAM 3 stores the XYZ coordinate values of respective edge points R1, R2, - - - , R8 in accordance with the data construction shown in FIG. 10.

In the next step 16, the CPU 2 compares the secondary lead floating amount $S_i$ with a predetermined threshold ST, and sets a float judge flag Fj to "0" when the secondary lead floating amount $S_i$ is not larger than the threshold ST, while setting the float judge flag Fj to "1" when the secondary lead floating amount $S_i$ exceeds the threshold ST. The data of thus valued float judge flag Fj are stored in the RAM 3 in relation to the lead number, the primary lead floating amount $\Delta Z_i$ and the secondary lead floating amount $S_i$, as shown in FIG. 8.

The purpose of providing the process of step 16 is to check whether any of the plural leads 10 arrayed in a line along one side face of the electronic component 9 is extraordinarily deformed in an up-and-down direction. If the lead row contains such a faulty lead, there will be a possibility that, when the leads 10 are soldered onto corresponding electrodes of a designated substrate, an open-circuit defect will arise at this faulty lead due to extraordinary deformation thereof in the up-and-down direction. Accordingly, in the event that the secondary lead floating amount $S_i$ exceeds the threshold ST, the float judge flag Fj corresponding to the lead number of this faulty lead is changed to "1", thereby indicating existence of the faulty lead.

If the calculation error is found in the step 12, the processes of the above-described steps 13 through 16 are disabled. However, it is mandatorily necessary to check the presence of an extraordinarily deformed lead in the lead row inspected. To this end, the present embodiment provides alternative steps 19 and 20 to do it in a more simple manner. More specifically, in the step 19, the CPU 2 calculates an altitudinal difference Ki between lower flat surfaces of the distal ends of adjacent two leads 10 arrayed along the same side face of the electronic component 9. The RAM 3 stores the altitudinal differences Ki calculated in this manner, in accordance with the data construction shown in FIG. 11. The altitudinal differences Ki are obtained by calculating a difference between the measured Z-coordinate values of any adjacent two leads.

Then, in the step 20, the CPU 2 compares each of the altitudinal differences Ki with the predetermined threshold ST and sets the float judge flag Fj to "0" when the altitudinal difference Ki is not larger than the threshold ST, while setting the float judge flag Fj to "1" when the altitudinal difference Ki exceeds the threshold ST. In short, the secondary lead floating amount $S_i$ is replaced by the altitudinal difference Ki in the event of failure of calculation in the step 11. The data of thus valued float judge flag Fj are stored in the RAM 3 in relation to the lead number, the Z-coordinate value $Z_i$, the altitudinal difference Ki, as shown in FIG. 11.

Once the procedure of the steps 11 through 16 (or steps 19 and 20) is completed, the CPU proceeds to a step 17 to check whether or not the side number counter "j" is 4. If the judgement is "NO" in the step 17, the CPU 2 proceeds to a step 18 to increment the value of the side number counter "j" by adding 1, then returns to the step 11 to repeat the same procedure on the basis of positional data of another lead row of leads 10 protruding from another side face designated by the side number counter "j".

When all of leads 10 protruding from four side faces of the rectangular electronic component 9 are processed in the steps 11 through 20, the side number counter "j" becomes 4 in the step 17. Thus, the CPU 2 proceeds to a step 21 to check the values of float judge flags Fj. If there is any flag Fj indicating existence of a faulty lead, the CPU 2 judges in a step 22 that an abnormal condition is found, and then proceeds to a step 27 to finalize the defectiveness of the inspected electronic component 9. On the other hand, if there is no flag Fj indicating existence of a faulty lead, the CPU 2 judges in the step 22 that no abnormal condition is found, and then proceeds to a step 23.

Next, the CPU 2 inspects the configuration of the electronic component 9 based on the mutual positional relationship between any two of the approximate straight lines $L_1$ through $L_4$. FIG. 9 is a perspective view showing the positional relationship of the approximate straight lines obtained in accordance with the embodiment of the present invention.

In a step 23, the CPU 2 obtains altitudinal differences $G_i$, where i=1, 2, 3 and 4, each representing an altitudinal difference between corresponding edge points of adjacent two approximate straight lines. That is, $G_1$ is an altitudinal difference between the edge point R2 of the approximate straight line $L_1$ and the edge point R3 of the approximate straight line $L_2$; $G_2$ is an altitudinal difference between the edge point R4 of the approximate straight line $L_2$ and the edge point R5 of the approximate straight line $L_3$; $G_3$ is an altitudinal difference between the edge point R6 of the approximate straight line $L_3$ and the edge point R7 of the approximate straight line $L_4$; and $G_4$ is an altitudinal difference between the edge point R8 of the approximate straight line $L_4$ and the edge point R1 of the approximate straight line $L_1$.

As the Z-coordinate values $Q_1, Q_2, \text{---} Q_8$ of respective end points R1, R2, ---, R8 are already obtained in the step 15, the CPU 2 simply obtains the altitudinal differences $G_1$ through $G_4$ by calculating a difference of the corresponding Z-coordinate values (i.e. $G_1=|Q_3-Q_2|$, $G_2=|Q_5-Q_4|$, $G_3=|Q_7-Q_6|$ and $G_4=|Q_1-Q_8|$).

Subsequently, the CPU 2 compares each of thus calculated altitudinal difference $G_1$ through $G_4$ with a predetermined threshold GT. If any of the altitudinal differences $G_1$ through $G_4$ exceeds the threshold GT, the CPU 2 judges in a step 24 that there is an abnormal condition and proceeds to the step 27 to finalize the defectiveness of the inspected electronic component 9. If none of the altitudinal differences $G_1$ through $G_4$ exceeds the threshold GT, the CPU 2 judges in the step 24 that there is no abnormal condition and proceeds to a step 25.

Figure 12:
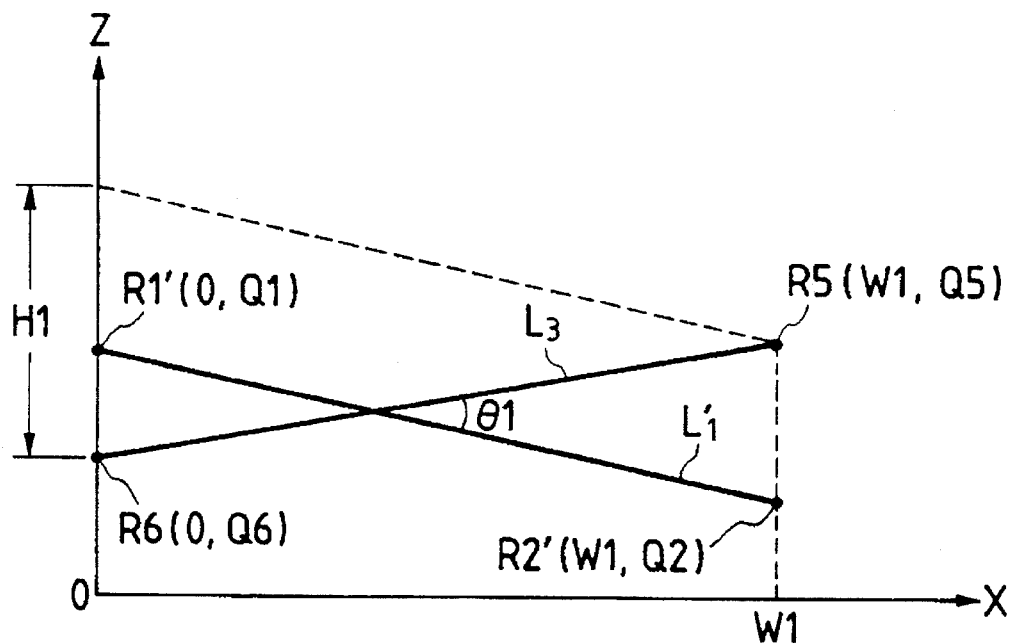
FIG. 12 is a graph showing mutual positional relationship between opposing approximate lines adopted in the electronic component inspecting method in accordance with the embodiment of the present invention.
Figure 13:
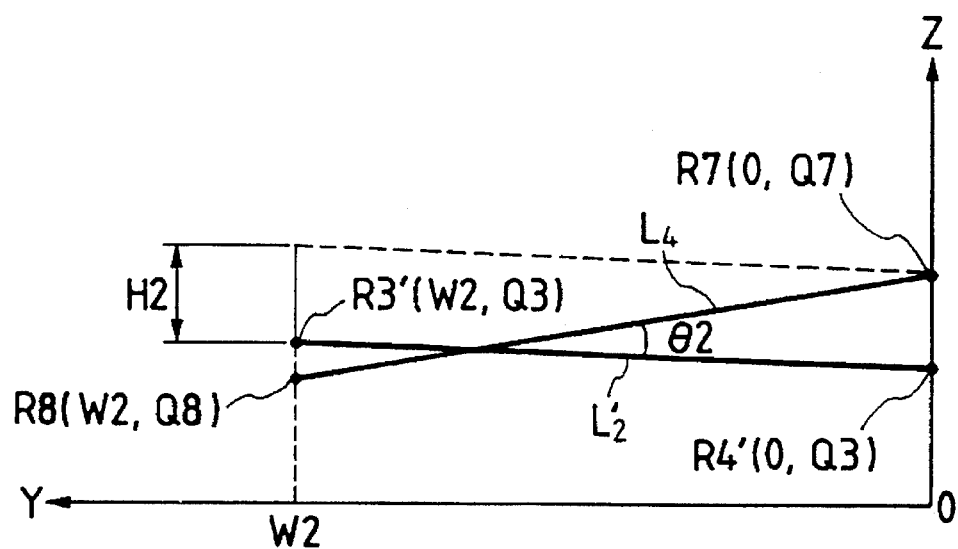
FIG. 13 is another graph showing mutual positional relationship between the other opposing approximate lines adopted in the electronic component inspecting method in accordance with the embodiment of the present invention.

In the step 25, the CPU 2 compares another combination of two approximate straight lines which are opposed and parallel with each other. More specifically, the opposing approximate straight lines $L_1$ and $L_3$ are provisionally projected on the XZ plane so as to superpose them on the same plane, as shown in FIG. 12 wherein a straight line $L_1'$ represents a projected line of the approximate straight lines $L_1$. Similarly, the opposing approximate straight lines $L_2$ and $L_4$ are provisionally projected on the YZ plane so as to superpose them on the same plane, as shown in FIG. 13 wherein a straight line $L_2'$ represents a projected line of the approximate straight lines $L_2$.

Then, an imaginary line (a dotted line) is given in FIG. 12 by parallel shifting the projected approximate line $L_1'$ upward until the edge points R2' of the projected approximate line $L_1'$ meets the edge point R5 of the approximate line $L_3$. Thus, an altitudinal difference $H_1$ between the projected approximate line $L_1'$ and the approximate line $L_3$ is obtained at the other ends of the projected approximate line $L_1'$ and the approximate line $L_3$. This altitudinal difference $H_1$ is specified as an altitudinal difference between opposing two approximate straight lines $L_1$ and $L_3$. The CPU 2 calculates this altitudinal difference $H_1$ by the following equation.

$$H_1 = W_1 \cdot \tan \theta_1 = |a_1 - a_3| \cdot W_1 \quad (3)$$

where $\theta_1$ represents an angle formed between the approximate straight lines $L_1$ and $L_3$.

Then, the CPU 2 compares thus obtained altitudinal difference $H_1$ with a predetermined threshold HT. If the altitudinal difference $H_1$ exceeds the predetermined threshold HT, the CPU 2 judges in a step 26 that there is an abnormal condition and proceeds to the step 27 to finalize the defectiveness of the inspected electronic component 9. On the other hand, if the altitudinal difference $H_1$ does not exceed the predetermined threshold HT, the CPU 2 judges in the step 26 that there is no abnormal condition and proceeds to a step 29 to finalize the non-defectiveness of the inspected electronic component 9.

The CPU 2 executes the same procedure for the other opposing approximate straight lines $L_2$ and $L_4$. Namely, an altitudinal difference $H_2$ is obtained by the following equation.

$$H_2 = W_2 \cdot \tan \theta_2 = |a_2 - a_4| \cdot W_2 \quad (4)$$

where $\theta_2$ represents an angle formed between the approximate straight lines $L_2$ and $L_4$. And, the CPU 2 compares thus obtained altitudinal difference $H_2$ with the predetermined threshold HT. If the altitudinal difference $H_2$ exceeds the predetermined threshold HT, the CPU 2 judges in the step 26 that there is an abnormal condition and proceeds to the step 27 to finalize the defectiveness of the inspected electronic component 9. On the other hand, if the altitudinal difference $H_2$ does not exceed the predetermined threshold HT, the CPU 2 judges in the step 26 that there is no abnormal condition and proceeds to the step 29 to finalize the non-defectiveness of the inspected electronic component 9.

The purpose of providing the procedure of steps 23 through 26 is to check whether any lead row protruding from one side of the electronic component 9 is extraordinarily offset from another lead row protruding from another side of the electronic component 9. For example, if the electronic component 9 is accidentally subjected to deformation (e.g. twist), an altitudinal difference may be so excessively caused between adjacent two lead rows that the electronic component 9 is troubled by the open-circuit defect in the soldering operation of leads onto electrodes of an substrate. Thus, the present embodiment replaces each lead row by an approximate straight line defined using a mathematical expression, and checks whether the mutual positional relationship (deviation) between any two approximate straight lines is within a predetermined range (threshold), thereby inspecting perfectness of the electronic component 9 in configuration.

By the way, if any calculation error is found in the step 12, the procedure of steps 23 through 26 will be executed by using a lesser number of approximate straight lines securely obtained without calculation errors.

When a series of steps 21 through 26 finds any abnormal condition, the CPU 22 declares defectiveness of the inspected electronic component 9 (step 27), displaying detailed information with respect to the found defective using the CRT 4 (step 28). On the other hand, if no abnormality is found, the CPU 2 declares non-defectiveness of the inspected electronic component 9 (step 29), notifying an operator of the judgement result through the CRT 4 (step 28).

The electronic component inspecting method in accordance with one embodiment of the present invention can be applied to many practical systems in various ways; for example, this inspecting method can be incorporated into a mounting (soldering) method of an electronic component onto a designated substrate.

Figure 14:
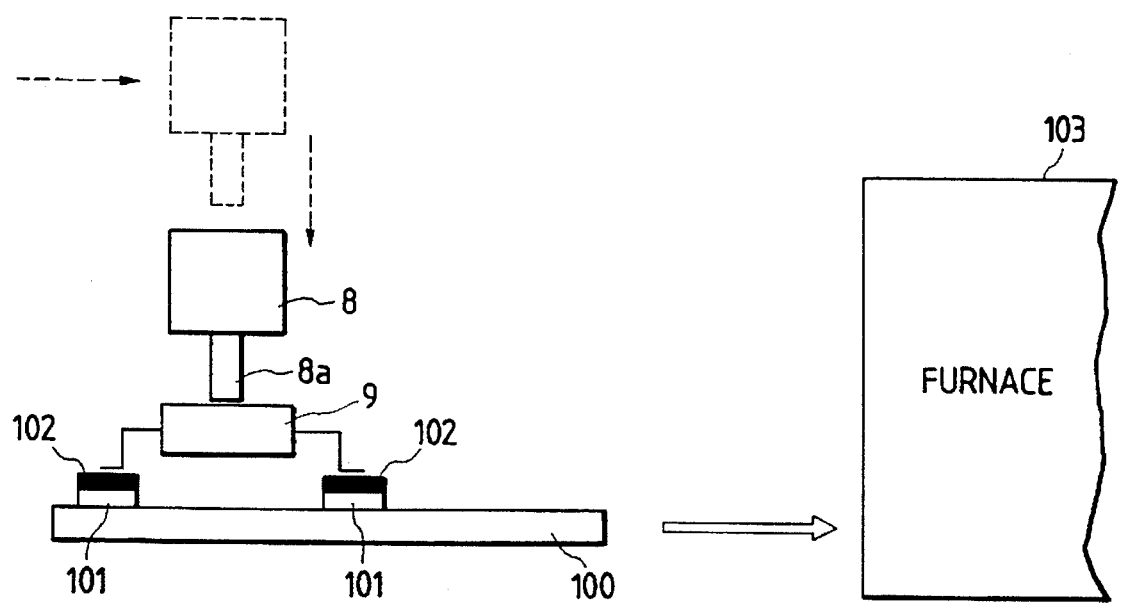
FIG. 14 is a view showing a schematic diagram illustrating a mounting/soldering operation of the present embodiment apparatus.

FIG. 14 is a view showing a schematic diagram illustrating a mounting/soldering operation of the present embodiment apparatus shown in FIG. 1. More specifically, the FIG. 1 apparatus can be operated as a mounting/soldering apparatus for mounting the electronic component 9 onto a substrate 100. In this case, the substrate 100 is provided with electrodes 101 on the upper surface thereof. Each electrode 101 is applied solder 102 on the top thereof. The substrate 100 is positioned somewhere within a movable zone of the transportation head 8. The previously described inspection of the electronic component 9 is executed on the way of transporting the electronic component 9 onto the substrate 100 (Step 2 of FIG. 3 flow chart). Thus, only the electronic components 9 judged to be non-defective (Step 3 of FIG. 3) are mounted on the substrate 100 so that leads 10 of the electronic component 9 are landed and positioned on the corresponding electrodes 101 (Step 4 of FIG. 3). On the other hand, the electronic component 9, if judged to be defective, is abandoned (Step 5 of FIG. 3). The substrate 100 mounting the electronic component 9 is then sent to a furnace 103, wherein the temperature is increased above the melting point of the solder 102 and thereafter lowered to solder the leads 10 of the electronic component 9 onto electrodes 101 of the substrate 100, thereby providing a rigid connection between the leads 10 and the electrodes 101. In this manner, the present embodiment can detect and exclude defective electronic components 9 beforehand, therefore, it becomes possible to prevent undesirable open-circuit defects from being generated in the soldering operation of leads 10 of the electronic component 9 onto corresponding electrodes 101 on the substrate 100.

As this invention may be embodied in several forms without departing from the spirit of essential characteristics thereof, the present embodiment as described is therefore intended to be only illustrative and not restrictive, since the scope of the invention is defined by the appended claims rather than by the description preceding them, and all changes that fall within metes and bounds of the claims, or equivalents of such metes and bounds, are therefore intended to be embraced by the claims.

What is claimed is:

1. A method for inspecting an electronic component having a plurality of lead rows, each lead row including plural leads arrayed in a line along and protruding from a side face of a main body thereof, said method comprising steps of:

measuring positional data of said plural leads, said positional data including altitudinal values representing heights of respective leads;

obtaining a plurality of approximate lines on the basis of said positional data, each approximate line approximating each lead row of said plural leads on a side face of the main body of said electric component; and obtaining a mutual positional relationship between said approximate lines, and judging whether said mutual positional relationship is within a predetermined range.

2. The inspecting method of an electronic component defined by claim 1, wherein said step of obtaining the mutual positional relationship between said approximate lines and judging whether said mutual positional relationship is within the predetermined range is executed by obtaining an altitudinal difference between corresponding edge points of adjacent two approximate lines, and judging whether said altitudinal difference is within the predetermined range.

3. The inspecting method of an electronic component defined by claim 1, wherein said step of obtaining the mutual positional relationship between said approximate lines and judging whether said mutual positional relationship is within the predetermined range is executed by obtaining an altitudinal difference between corresponding edge points of opposing two approximate lines, and judging whether said altitudinal difference is within the predetermined range.

4. A method for inspecting an electronic component having a plurality of lead rows, each lead row including plural leads arrayed in a line along and protruding from a side face of a main body thereof, said method comprising steps of:

measuring positional data of said plural leads, said positional data including altitudinal values representing heights of respective leads;

obtaining approximate lines on the basis of said positional data, each approximate line approximating each lead row of said plural leads on a side face of the main body of said electric component;

detecting a faulty lead on the basis of said positional data, said faulty lead being extraordinarily deformed compared with other leads constituting a same lead row; and obtaining a mutual positional relationship between said approximate lines, and judging whether said mutual positional relationship is within a predetermined range.

5. The inspecting method of an electronic component defined by claim 4, wherein said step of obtaining the mutual positional relationship between said approximate lines and judging whether said mutual positional relationship is within the predetermined range is executed by obtaining an altitudinal difference between corresponding edge points of adjacent two approximate lines, and judging whether said altitudinal difference is within the predetermined range.

6. The inspecting method of an electronic component defined by claim 4, wherein said step of obtaining the mutual positional relationship between said approximate lines and judging whether said mutual positional relationship is within the predetermined range is executed by obtaining an altitudinal difference between corresponding edge points of opposing two approximate lines, and judging whether said altitudinal difference is within the predetermined range.

7. A method for mounting an electronic component onto a substrate, said electronic component having a plurality of lead rows, each lead row including plural leads arrayed in a line along and protruding from a side face of a main body of said electronic component, said method comprising steps of:

measuring positional data of said plural leads, said positional data including altitudinal values representing heights of respective leads;

obtaining a plurality of approximate lines on the basis of said positional data, each approximate line approximating each lead row of said plural leads on a side face of the main body of said electric component;

obtaining a mutual positional relationship between said approximate lines, and judging whether said mutual positional relationship is within a predetermined range;

positioning the leads of the electronic component onto electrodes of said substrate only when said mutual positional relationship is within said predetermined range, said electrodes being applied solder beforehand; and heating said substrate mounting said electronic component and melting said solder to provide a rigid connection between said leads and said electrodes.

8. The mounting method of an electronic component defined by claim 7, wherein said step of obtaining the mutual positional relationship between said approximate lines and judging whether said mutual positional relationship is within the predetermined range is executed by obtaining an altitudinal difference between corresponding edge points of adjacent two approximate lines, and judging whether said altitudinal difference is within the predetermined range.

9. The mounting method of an electronic component defined by claim 7, wherein said step of obtaining the mutual positional relationship between said approximate lines and judging whether said mutual positional relationship is within the predetermined range is executed by obtaining an altitudinal difference between corresponding edge points of opposing two approximate lines, and judging whether said altitudinal difference is within the predetermined range.

10. A method for mounting an electronic component onto a substrate, said electronic component having a plurality of lead rows, each lead row including plural leads arrayed in a line along and protruding from a side face of a main body of said electronic component, said method comprising steps of:

measuring positional data of said plural leads, said positional data including altitudinal values representing heights of respective leads;

obtaining a plurality of approximate lines on the basis of said positional data, each approximate line approximating each lead row of said plural leads on a side face of the main body of said electric component;

detecting a faulty lead on the basis of said positional data, said faulty lead being extraordinarily deformed compared with other leads constituting a same lead row;

obtaining a mutual positional relationship between said approximate lines, and judging whether said mutual positional relationship is within a predetermined range;

positioning the leads of the electronic component onto electrodes of said substrate only when said faulty lead is not detected and said mutual positional relationship is within said predetermined range, said electrodes being applied solder beforehand; and heating said substrate mounting said electronic component and melting said solder to provide a rigid connection between said leads and said electrodes.

11. The mounting method of an electronic component defined by claim 10, wherein said step of obtaining the mutual positional relationship between said approximate lines and judging whether said mutual positional relationship is within the predetermined range is executed by obtaining an altitudinal difference between corresponding edge points of adjacent two approximate lines, and judging whether said altitudinal difference is within the predetermined range.

12. The mounting method of an electronic component defined by claim 10, wherein said step of obtaining the mutual positional relationship between said approximate lines and judging whether said mutual positional relationship is within the predetermined range is executed by obtaining an altitudinal difference between corresponding edge points of opposing two approximate lines, and judging whether said altitudinal difference is within the predetermined range.

\* \* \* \* \*